United States Patent [19]
Stolmeijer

[11] Patent Number: 5,874,317
[45] Date of Patent: Feb. 23, 1999

[54] TRENCH ISOLATION FOR INTEGRATED CIRCUITS

[75] Inventor: André Stolmeijer, Santa Clara, Calif.

[73] Assignee: Advanced Micro Devices, Inc., Sunnyvale, Calif.

[21] Appl. No.: 662,224

[22] Filed: Jun. 12, 1996

[51] Int. Cl.⁶ .................................................. H01L 21/76
[52] U.S. Cl. ...................... 437/67; 437/228 IS; 437/947; 437/981; 148/DIG. 50; 148/DIG. 161; 156/643.1
[58] Field of Search ................................ 437/67, 228 IS, 437/62, 63, 947, 981; 148/DIG. 50, DIG. 161; 156/643.1

[56] References Cited

U.S. PATENT DOCUMENTS

| | | |
|---|---|---|
| 4,693,781 | 9/1987 | Leung et al. .......................... 156/643.1 |
| 4,729,815 | 3/1988 | Leung .................................. 156/643.1 |
| 4,839,306 | 6/1989 | Wakamatsu .............................. 437/67 |
| 4,857,477 | 8/1989 | Kanamori ................................. 437/47 |
| 4,905,065 | 2/1990 | Selcuk et al. . |
| 5,445,989 | 8/1995 | Lur et al. . |
| 5,445,990 | 8/1995 | Yook et al. . |
| 5,457,339 | 10/1995 | Komori et al. . |
| 5,459,096 | 10/1995 | Venkatesan et al. . |
| 5,460,998 | 10/1995 | Liu . |
| 5,466,623 | 11/1995 | Shimize et al. . |
| 5,468,675 | 11/1995 | Kaigawa . |
| 5,468,676 | 11/1995 | Madan . |
| 5,470,783 | 11/1995 | Chiu et al. . |
| 5,472,904 | 12/1995 | Figura et al. . |
| 5,472,905 | 12/1995 | Paek et al. . |
| 5,472,906 | 12/1995 | Shimize et al. . |
| 5,473,186 | 12/1995 | Morita . |
| 5,474,953 | 12/1995 | Shimizu et al. . |

FOREIGN PATENT DOCUMENTS

0271620  11/1990  Japan .

OTHER PUBLICATIONS

Fuse, Genshu; Fukumoto, Masanori; Shinohara, Akihira; Odanaka, Shinji; Sasago, Masaru and Ohzone, Takashi, "A New Isolation Method with Boron–Implanted Sidewalls for Controlling Narrow–Width Effect" IEEE Transactions On Electron Devices, vol. ED–34, No. 2, Feb., 1987.

Sawada, Shizuo; Higuchi, Takayoshi; Mizuno, Tomohisa; Shinozaki, Satoshi and Ozawa, Osamu, "Electrical Properties for MOS LSI's Fabricated Using Stacked Oxide SWAMI Technology" IEEE Transactions on Electron Devices, vol. ED–32, No. 11, Nov. 1985.

Wolf Ph.D., Stanley, Chapter 6.6.7 "Trench Isolation for CMOS", *Silicon Processing for the VLSI Era—vol. 3: The Submicron Mosfet*, pp. 406–413, 1995.

Wolf Ph.D., Stanley, Chapter 2 "Isolation Technologies for Integrated Circuits", *Silicon Processing for the VLSI Era— vol. 2: Process Integration*, pp. 12–69, 1990.

*Primary Examiner*—Trung Dang
*Attorney, Agent, or Firm*—Foley & Lardner

[57] ABSTRACT

A method of fabricating an integrated circuit with trenches, without parasitic edge transistors, for isolating FET transistors from each other without degrading the FETs operating characteristics by junction leakage, breakdown or shorting, when a metal silicide is used in the source/drain regions. A silicon wafer is formed with sidewalls on the sides of each area in which a groove is to be etched. In etching the silicon, the sidewalls define the lateral dimension of the trenches. After the trenches are etched, the sidewalls are removed and the trenched are filled with an insulating material using a high density plasma reactor, such as an electron cyclotron resonance (ECR) plasma reactor. This type of reactor simultaneously deposits and sputter etches so that silicon edges at the base of the now removed sidewalls become tapered at an angle of about 45° during deposition. Thus, the profiles of the filled trenches all have tapered tops which reduces the possibility of parasitic edge transistors and any leakage or shorting.

10 Claims, 6 Drawing Sheets

TRENCH ISOLATION FOR INTEGRATED CIRCUITS

CROSS REFERENCES TO RELATED APPLICATIONS

This application is related to U.S. patent application Ser. No. 08/662,217, entitled Trench Isolation of Field Effect Transistors, filed on an even date herewith.

FIELD OF THE INVENTION

This invention relates to fabricating integrated circuits with trench isolation of semiconductor devices and, more particularly to the method and apparatus for filling grooves openings with insulation to form the trenches, and the resulting structure of the integrated circuit.

BACKGROUND OF THE INVENTION

With higher levels of integrated circuits on semiconductor chips, such as silicon, and the need exists for faster transistors in these circuits which can be accomplished by substantially reducing and even eliminating leakage between semiconductor devices in the integrated circuit and/or preventing the formation of parasitic transistors. For example, with trench isolation, an integrated circuit with field effect transistors (FETs), having each of their gates insulated from the silicon body by a gate oxide and positioned between a source and drain in the silicon, must be fabricated to either minimize or eliminate any parasitic edge or corner transistors at the interface of the FET region and the trench at the cross over of the gate electrode. FETs in such integrated circuits without parasitic edge transistors perform at faster switching speed and without the potential of latchup.

Higher levels of integration requires increasing numbers of transistors isolated from each other in essentially the same amount of silicon real estate as lower levels of integration. Trench isolation, in contrast to recessed oxidation isolation, commonly know as LOCOS, is the formation of thin, vertical grooves in the silicon so that the amount of silicon real estate is minimized, thereby leaving more silicon for the semiconductor devices and passive devices. Trenches normally are fabricated by anisotropically etching with a plasma gas(es) to which the silicon is selective to create substantially parallel walls or an U-shape groove deep in the silicon. If desired, V-shaped grooves can be formed by preferential wet etching of the (110) crystal plane of a {100} silicon wafer. Both types of trenches are filled with an insulating material, preferably an oxide of silicon. The walls of the etched silicon can be thermally oxidized prior to filling the trench, if so desired.

Although trench isolation saves silicon for more semiconductor devices and passive devices, this isolation technique produces parasitic transistors due to diffusion of the source and drain impurities of the FET at the edges of the trench. These parasitic transistors are detrimental to the integrated circuit for at least two reasons. They increase the OFF current of the FETs, and they turn on at a lower voltage than the FETs and create a "subthreshold kink" in the current-voltage ($I_D$-$V_G$) characteristic curve. As the FETs are designed with smaller and smaller dimensions for higher levels of integration, the applied voltage to the FET is being lowered and the detrimental influence of the parasitic edge transistor on the operation of integrated circuit becomes even greater. One technique for reducing parasitic edge transistors is to round the edges at the top of the groove opening which is filled with insulation and to provide a gate insulation of any potential parasitic transistor which will be thicker than the gate insulation of the FET.

In addition to trying to prevent leakage and/or the formation of parasitic transistors, it difficult to deposit the insulating material into the grooves so that the grooves are completely and uniformly filled in forming the trenches. In addition, when the depth of the grooves are increased, they are more difficult to fill, especially when the aspect ratio of depth to width is 2 to 1 or greater. In using chemical vapor deposition (CVD) to fill the grooves to form the trenches with silicon containing source gases, especially a source gas, such as silane which forms nonconformal silicon oxide, care must be taken during deposition so that the deposited material does not grow shoulders at the top of the grooves which may eventually close off before the bottom of the grooves are filled.

SUMMARY OF THE INVENTION

The primary object of the present invention is provide a method of forming isolating trenches in integrated circuits which overcome the parasitic transistor problem.

Another object of the present invention is provide a method of forming isolating trenches in integrated circuits which uniformly fills the groove openings.

These objects are achieved in accordance with the present invention by depositing the insulating material with a high density plasma reactor, which can be operated to both deposit and etch, either simultaneously or sequentially, so as to deposit high quality silicon oxide ($Sio_2$) layers in the groove openings to form isolating trenches with tapered upper edges. The deposition of $SiO_2$ occurs in a vertical direction while the sputtering is angle dependent with its highest yield being at 45° so that any corners of the material being deposited and any corners of a material only slightly less selective than the material being deposited will be etched at an angle of about 45°. Other plasma apparatus that can perform deposition and etching are a transformer coupled plasma (TCP) reactor and a helicon coupled plasma (HCP) reactor. Alternatively, two separate reactors may be used, one being for deposition and the other for etching. Preferably, either tetraethylorthosilane (TEOS) or tetramethycyclosiloxane (TMCTS) is used as the silicon containing source gases. Both of these source gases produce conformal silicon oxide deposits.

BRIEF DESCRIPTION OF THE DRAWINGS

The foregoing and other objects, aspects and advantages will be better understood from the following detailed description of a preferred embodiments of the invention with reference in the drawings, in which.

DETAILED DESCRIPTION OF THE PREFERRED EMBODIMENTS OF THE INVENTION

Figure 1:
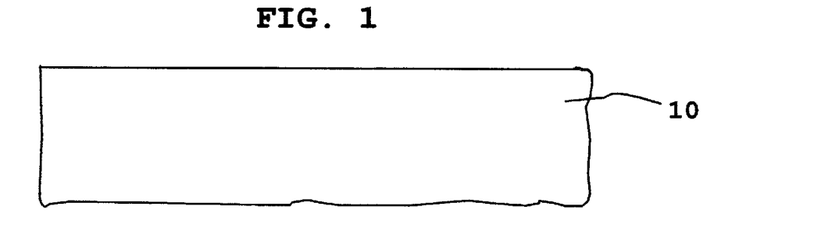
FIG. 1 is a cross-sectional view of a portion of a silicon wafer.
Figure 2:
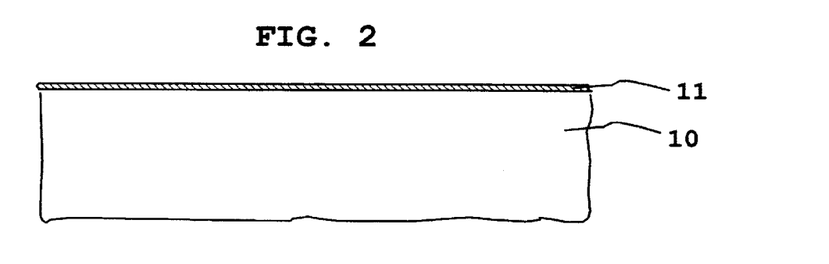
FIG. 2 is a cross-sectional view of the portion of the silicon wafer of FIG. 1 with an insulating layer thereon.

A preferred embodiment of the integrated circuit of the present invention includes field effect transistors (FET) and comprises a semiconductor substrate, herein a silicon wafer 10 with a {100} plane orientation as shown in FIG. 1. The wafer 10 is doped with an appropriate impurity depending on whether the FETs are to be N-type or P-type. If the FETs are to be complementary N-type and P-type, such as a complementary metal oxide silicon (CMOS) FET, selected portions of the wafer 10 will be doped with an appropriate impurity to form wells in the complementary areas. To simplify the description of the present invention, the preferred embodiment of the integrated circuit is an N-type FET and the wafer 10 is doped with a P-type impurity, herein boron (B), and includes a insulating layer, herein silicon oxide 11 thermally grown on and in the silicon wafer 10.

Figure 3:
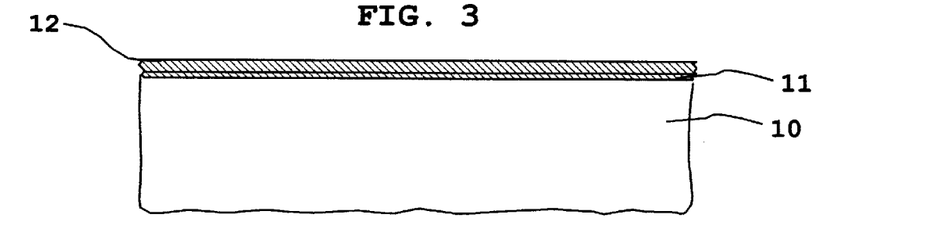
FIG. 3 is a cross-sectional view of the portion of the silicon wafer of FIG. 2 with an etch protective layer on the insulating layer.
Figure 4:
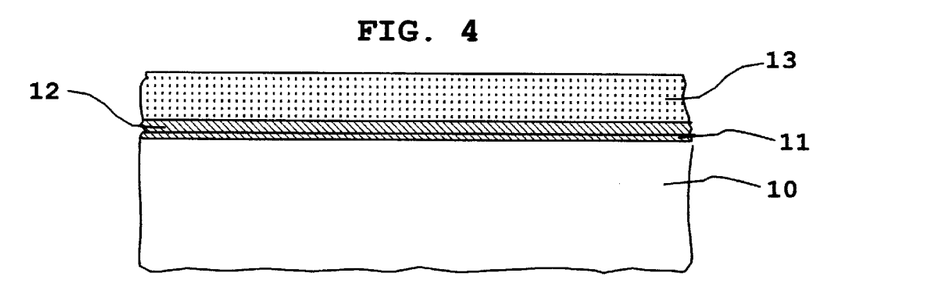
FIG. 4 is a cross-sectional view of the portion of the silicon wafer of FIG. 3 with a resist layer on the etch protective layer.

Because isolation trenches are to be subsequently formed, an etch protective layer, whose etch and polish selectivity is different than the insulating material for filling the trenches, is deposited on the silicon oxide layer 11 as shown in FIG. 3. In the present instant, the etch barrier material is a silicon nitride layer 12. To fabricate the various circuits of the integrated circuit, the portion of the silicon wafer 10, as exemplary of other parts of the wafer, is coated, preferably by a conventional spin coating apparatus, with a commercially available deep UV resist 13 as shown in FIG. 4.

Figure 5:
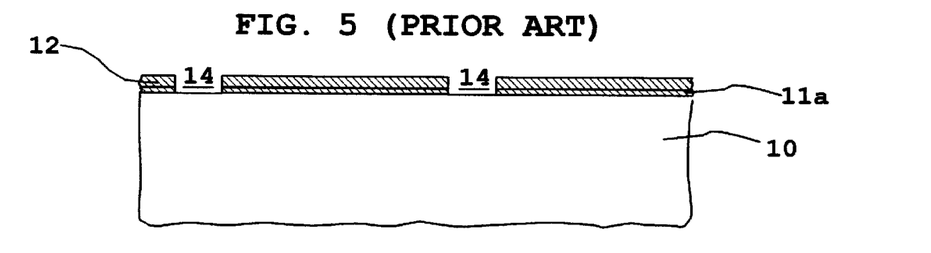
FIG. 5 is a cross-sectional view of the portion of the silicon wafer of FIG. 4 with openings etched in the etch protective layer and the insulating layer in accordance with the fabrication method of the prior art.
Figure 6:
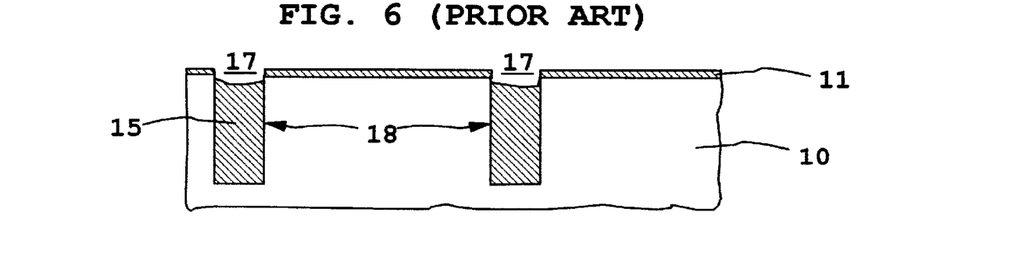
FIG. 6 is a cross-sectional view of the portion of the silicon wafer of FIG. 5 with groove openings filled with an insulating material which is recessed from the top of the groove in the fabrication method of the prior art.
Figure 7:
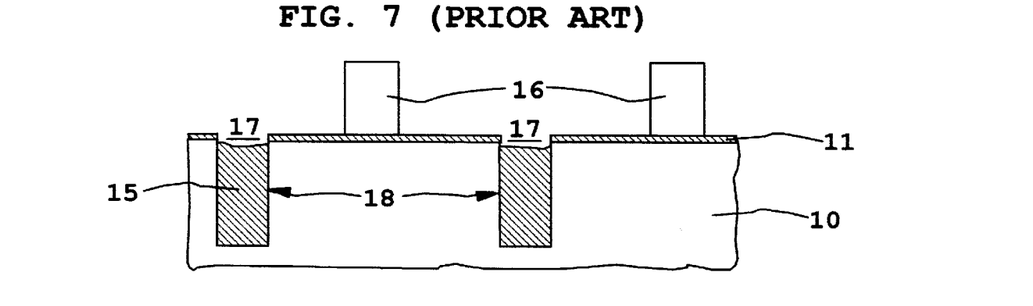
FIG. 7 is a cross-sectional view of the portion of the silicon wafer of FIG. 6 with the defined gate electrode on the gate insulating layer in the fabrication method of the prior art.
Figure 8:
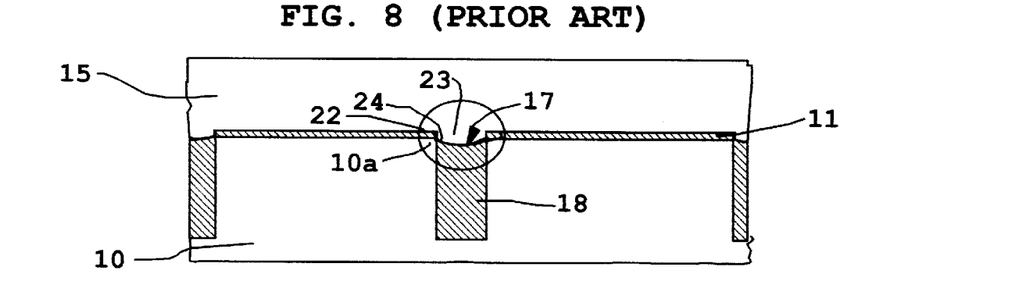
FIG. 8 is a cross-sectional view of the portion of the silicon wafer of FIG. 7 rotated 90° and taken through a gate electron in the fabrication method of the prior art.

In the prior art fabrication method as shown in FIG. 5, an etch pattern is defined in the exposed and developed resist 13 for groove openings 14 in first the nitride 12 and then the oxide layer 11. The opening 14 in the etch protective layer 12 serves as a pattern for etching groove openings (not shown) in the silicon wafer 10. After the groove opening is filled with insulating material 15, the etch protective layer is removed. As shown in FIG. 6, the underlying pad oxide layer 11a (FIG. 5) is removed (not shown) and a high quality gate oxide 11 is grown in its place on the surface of the silicon wafer 10. A conductive material, such as polysilicon, is deposited on the gate oxide layer 11 and a gate electrode 16 is defined in the conductive material as shown in FIG. 7, by a resist pattern (not shown). Overetching is required to remove the pad oxide 11a but also removes oxide material 15 and creates recesses 17 at the top of the now formed trenches 18, as shown in FIGS. 7 and 8. These recesses 16 of the trenches 18 are the cause of the two problems in a resulting integrated circuit, which were identified in the Background of the Invention and which will be explained by reference to FIGS. 8 and 9. In FIG. 8, the gate electrode 16, which is separated from the metal silicide 19 by insulating sidewalls 20 (FIG. 9), is shown crossing the trenches 18 and, with recesses 17 in the trenches, a structure may result to form parasitic transistors. When the gate electrode is being fabricated, the polysilicon is deposited on the gate oxide layer 11 and over the tops of the trenches 18 as shown in FIG. 8. Since the polysilicon will fill the recesses, a structure will form as shown in the circle 22 of FIG. 8. That structure consists of a conductive electrode 23, which is the polysilicon in the recesses on a gate insulator 24, which is part of the insulating material 15 of the trench 18, in contact with the silicon wafer 10a. When voltage is applied to the gate 16, a field is established between the electrode 23 and the wafer 10a across the insulation 24 and this unintentional structure becomes a parasitic transistor.

Figure 9:
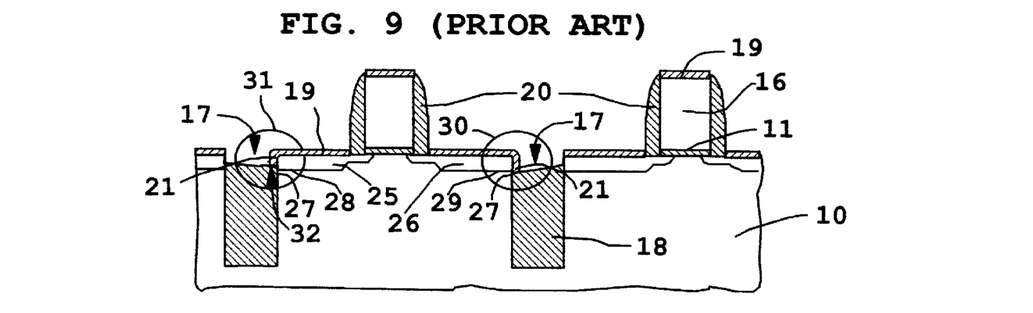
FIG. 9 is a cross-sectional view of the plan view of the portion of the silicon wafer of FIG. 7 showing a metal silicide in recesses of the trenches in the fabrication method of the prior art.

Turning now to the second problem; namely, junction leakage, breakdown and or shorting due to the metal silicide, FIG. 9 shows the metal silicide 19 with end portions 21 overlapping two of the trenches 18. Sources 25 and drains 26, with their metallurgical junctions depicted by lines 28 and 29 respectively, are shown extending to and abutting the walls 27 of the trenches 18. As shown in the circle 30, if the recess 17 in the trench is below the metallurgical junction 29 which allows the end portion 21 of metal silicate to extend below the metallurgical junction 29, the drain will be shorted and the FET transistor will not function. Even if the recess 17 in the trench and thus the end portion 21 of the metal silicate is above the metallurgical junction, as shown in circle 31, there will be leakage and possibly breakdown depending upon the distance between the metallurgical junction 28 and the bottom 32 of the recess 17.

Figure 10:
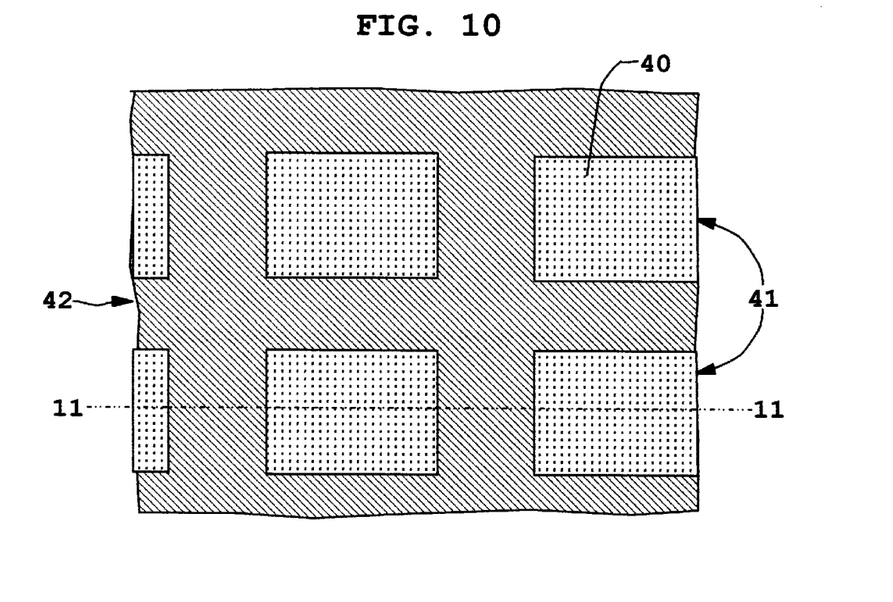
FIG. 10 is a plan view of the portion of the silicon wafer of FIG. 4 showing the exposed and developed resist on the etch protective layer in accordance with the present invention.
Figure 11:
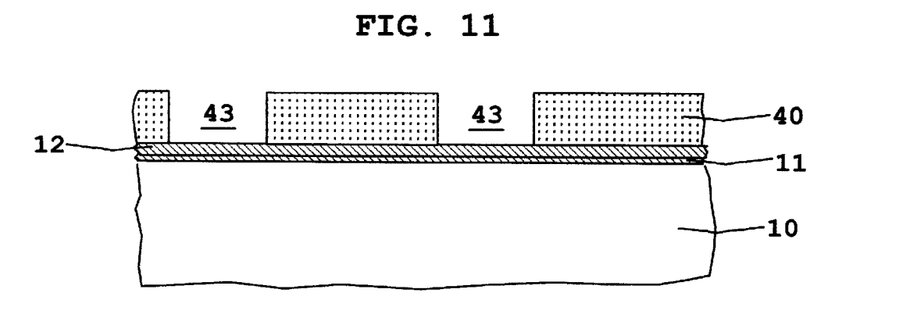
FIG. 11 is a cross-sectional view of the portion of the silicon wafer taken across line 11—11 of FIG. 10 showing the resist layer exposed and developed in trench patterns on opposite sides of an active area.
Figure 12:
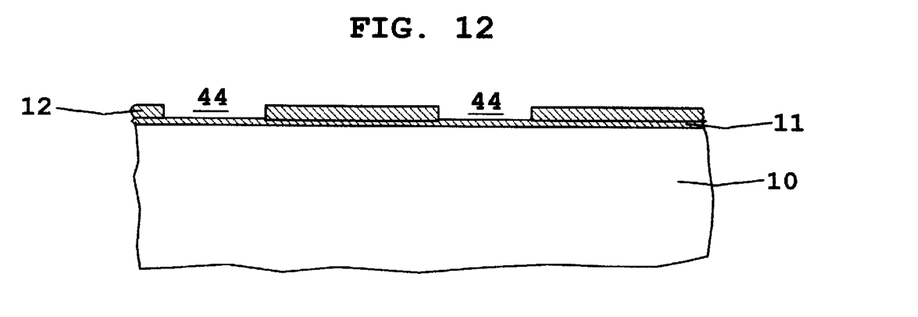
FIG. 12 is a cross-sectional view of the portion of the silicon wafer of FIG. 11 with the etch protective layer etched in trench pattern of the now removed resist.
Figure 13:
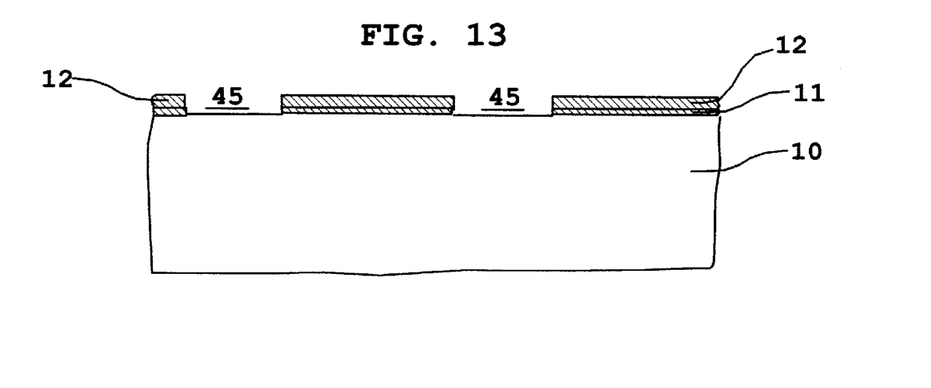
FIG. 13 is a cross-sectional view of the portion of the silicon wafer of FIG. 12 with the insulating layer etched.

Now, in accordance with the present invention as shown in plan view of FIG. 10, a resist 40 is exposed and developed and each die or chip (not shown) of the wafer 10 is divided into a number of active areas 41 and isolated by trench areas 42 to be formed in the silicon. As shown in FIG. 11, the resist 40 serves as an etch barrier for etching the silicon nitride layer 12 with the etched openings 43. As shown in FIG. 12 with the resist removed by ashing in an oxygen atmosphere as is well known in the art, openings 44 have been anisotropically etched in the silicon nitride layer, using $CF4:O_2$ as the plasma gas and a commercially available plasma reactor. The openings 44 in the silicon nitride layer 12 with the resist removed provides a pattern for anisotropically etching openings 45 in the silicon oxide layer 11 with the same parallel plate reactor but with plasma gases $CF_4:H_2$ for etching the silicon oxide as shown in FIG. 13.

Figure 14:
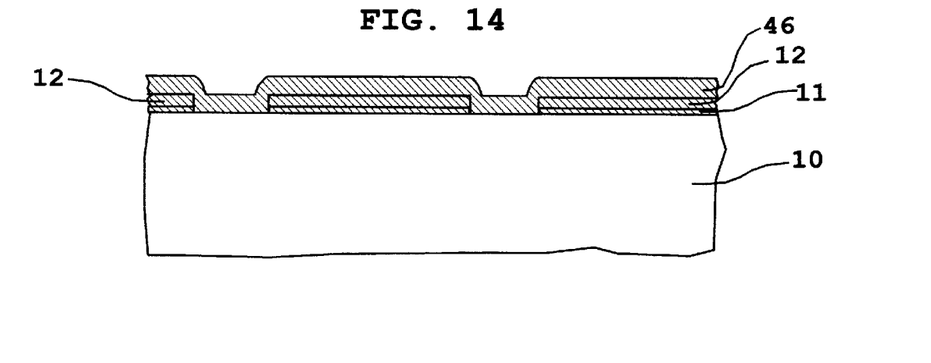
FIG. 14 is a cross-sectional view of the portion of the silicon wafer of FIG. 13 with a conformal insulating layer covering the etch protective layer and filling the etched openings.
Figure 15:
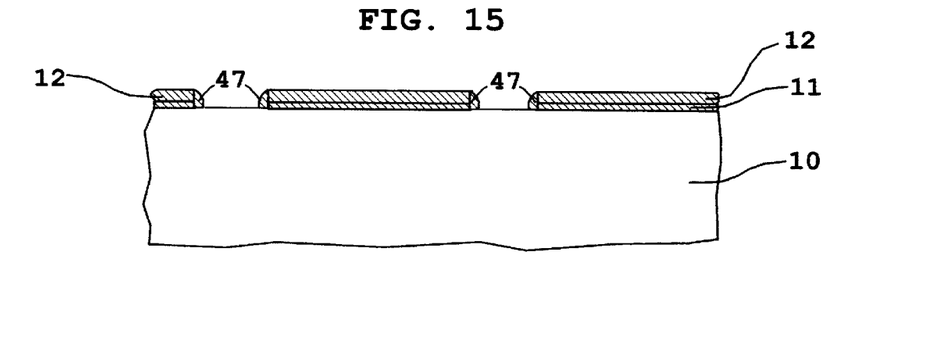
FIG. 15 is a cross-sectional view of the portion of the silicon wafer of FIG. 14 with covered insulating layer anisotropically etched to form sidewalls in the etched openings.
Figure 16:
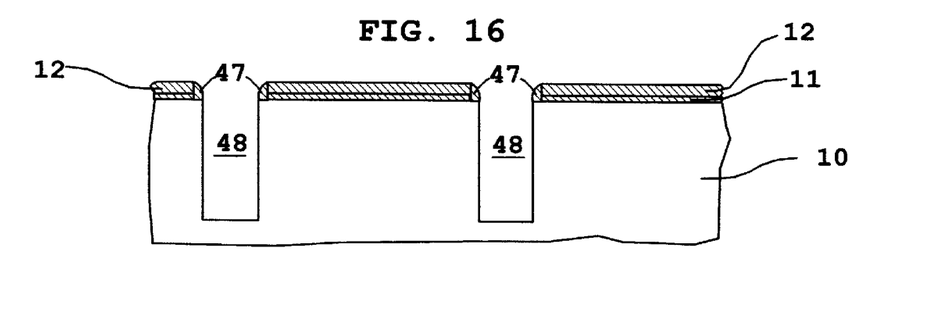
FIG. 16 is a cross-sectional view of the portion of the silicon wafer of FIG. 17 with the silicon etched in a pattern defined by the sidewalls.
Figure 17:
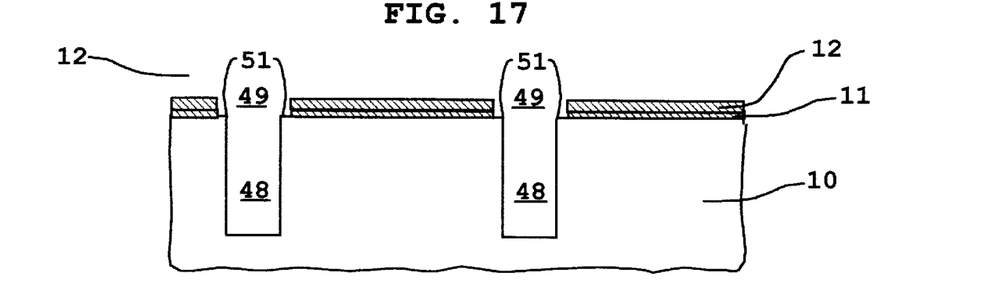
FIG. 17 is a cross-sectional view of the portion of the silicon wafer of FIG. 16 with the sidewalls removed.

In accordance with one aspect of the present invention, a conformal insulating material is deposited, herein silicon oxide 46 from TEOS by CVD as shown in FIG. 14. Again using the parallel plate reactor with plasma gases $CF_4:H_2$ for anisotropically etching the silicon oxide 46 to form sidewalls 47 on the end walls of silicon oxide layer 11 and the silicon nitride layer 12 as shown in FIG. 15. By using the silicon oxide sidewalls 47 as a pattern, groove openings 48, as shown in FIG. 16 are etched in the silicon wafer 10 using the parallel plate reactor and plasma gases of $SF_6:Cl_2$ for etching the silicon. The sidewalls 47 now are removed using the parallel plate reactor with plasma gases $CF_4:H_2$ to etch the silicon oxide sidewalls while protecting the silicon oxide gate insulating layer 11 with the protective etch silicon nitride layer 12 to leave openings 49 over the groove openings 48 which is wider than the width of the grove openings as shown in FIG. 17.

Figure 18:
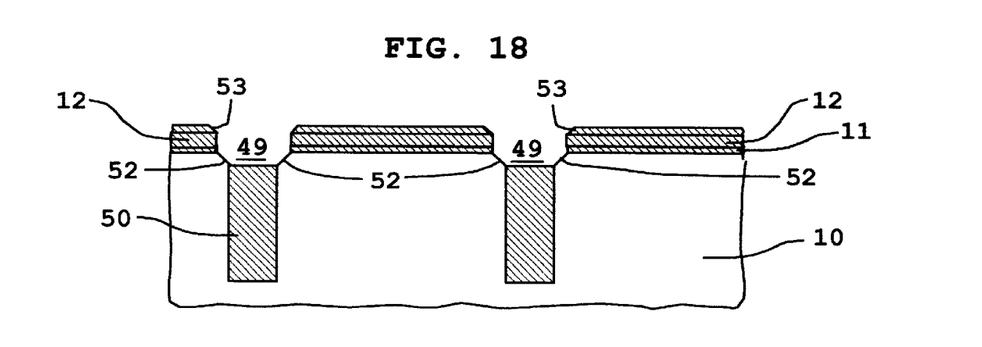
FIG. 18 is a cross-sectional view of the portion of the silicon wafer of FIG. 17 with the groove openings partially filled with insulating material and edges or corners of the silicon at the top of the openings and the edges or corners of the deposited material on top of the etch protective layer etched at 45° angles.
Figure 19:
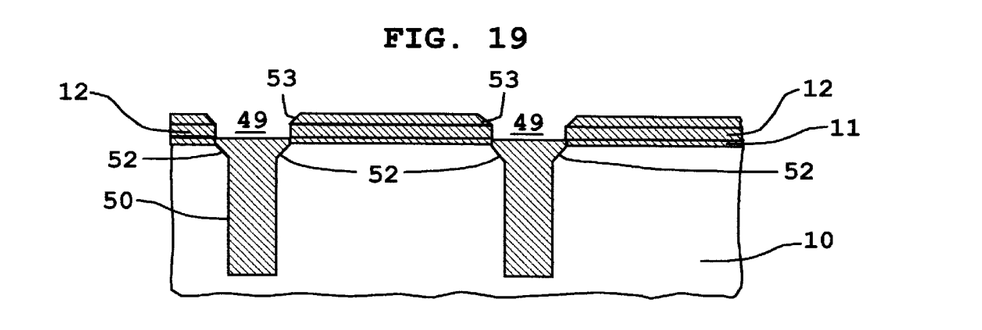
FIG. 19 is a cross-sectional view of the portion of the silicon wafer of FIG. 18 with further deposition of insulating material.

Now in accordance with a companion aspect of the present invention, a high density plasma reactor, which is capable of both deposition and anisotropically etching at various angles, either simultaneously or sequentially, such as an electron cyclotron resonance (ECR) plasma reactor, is used to deposit high quality insulating material, herein silicon dioxide 50 ($SiO_2$) in groove openings 21 as shown in FIG. 18. Preferably, a dual chamber ECR reactor is used to simultaneously deposit $SiO_2$ and etch the deposited $SiO_2$ with either $O_2$ or Argon (Ar) providing ions for sputter etching. Using an ECR reactor, a conformal $SiO_2$ layer 50 is deposited anisotropically or unidirectionally parallel to the sidewalls of the silicon nitride opening 49 so as to minimize any buildup of the deposited $SiO_2$ on the shoulders of the silicon nitride. In addition, the deposited $SiO_2$ is etched at approximately a 45° angle during deposition, which causes the deposited $SiO_2$ 50 to take on a sloped appearance as shown in FIG. 19. Thus, the combination of conformal source material for the insulating layer, unidirectional deposition, and sputter etching fills the groove openings 48 uniformly with insulation.

In accordance with the present invention, this combination not only results in a high quality uniform deposition of the insulating material 50 but, as will be latter described, eliminates the formation of edge parasitic transistors. The deposition of $SiO_2$ occurs in a vertical direction while the sputter etching is angle dependent with its highest yield being at 45°. Preferably, tetraethylorthosilane (TEOS) or, alternatively, tetramethycyclosiloxane (TMCTS) is used as a silicon containing source gases. Both of these source gases produce conformal films. Optionally, prior to filling the openings 48, the bottom and walls of the groove openings 48 may be heavily doped by implanting the appropriate impurity, and an oxide liner (not shown) may be thermally grown on the walls of the openings 48, as is well known in the art,prior to filling the openings. The dielectric constant of the insulating material filling the trenches should not be greater than about 4.0 . During the plasma deposition of silicon oxide 50 in the groove openings 48, a bias potential of the ECR is applied to induce sputter etching for uniform deposition of the silicon oxide. Because the highest yield of the sputter etching occurs at 45°, the top silicon corners 51 (FIG. 17) of the groove openings 48 of the silicon wafer 10 are etched at a 45° angle to form a tapered surface 52 as shown in FIG. 18. This tapered surface prevents the formation of edge or corner parasitic transistors.

As a specific example of the operating conditions for depositing $SiO_2$ in the groove openings 21 with a high density plasma reactor, herein an ECR. The silicon wafer 10 is supported on an rf biased electrode and two different operating conditions are used with plasma gases of $SiH_4$, $O_2$ and Ar. Initially, the power is 1200 watts (W) with an rf bias of 1200–2000 W and the $Ar/0_2/SiH_4$ ratio is 1.5/1.14 2.0/1.0. Next, after the corners 24 of the silicon wafer 10 are tapered, the rf bias turned off and only $O_2$ and $SiH_4$ are utilized in a ratio of 1.4–2.0/1.0.

Although ECR is preferred, other high density plasma reactors that can perform deposition and etching and can be used in place of ECR are a transformer coupled plasma (TCP) reactor and a helicon coupled plasma (HCP) reactor. Alternatively, a separate etching apparatus may be used to perform etching in conjunction with plasma deposition apparatus.

Figure 20:
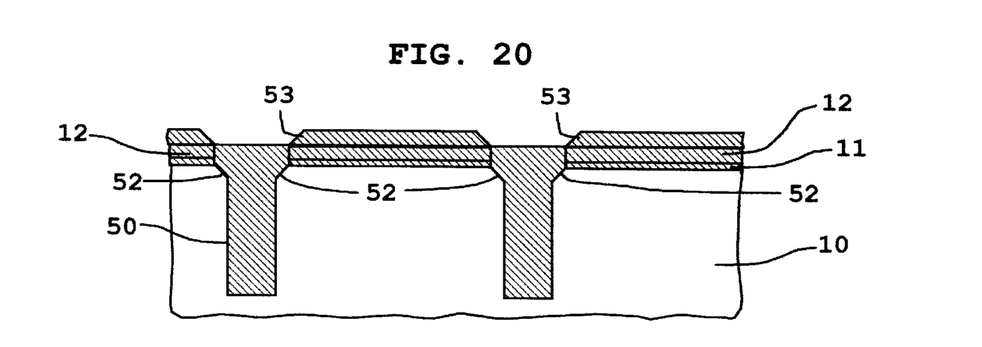
FIG. 20 is a cross-sectional view of the portion of the silicon wafer of FIG. 19 with the groove openings filled with insulating material to the upper surface of the etch protective layer.
Figure 21:
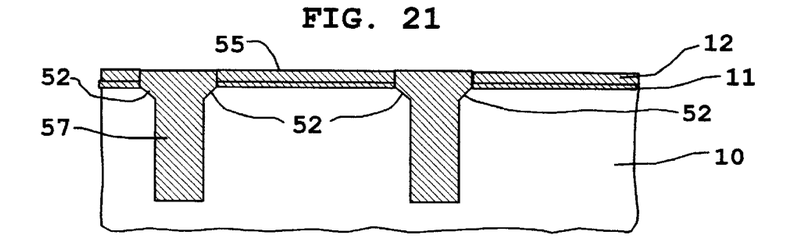
FIG. 21 is a cross-sectional view of the portion of the silicon wafer of FIG. 20 showing the insulating material planarized level with the top surface of the etch protective layer.

During continuing deposition of the silicon oxide, corners of the deposited material 50 on the silicon nitride layer 12, also are etched to form 45° angle surfaces 53 as shown in FIGS. 18, 19 and 20. Preferably, the groove openings 48 are filled essentially with the silicon oxide insulating material 50 as shown in FIG. 20. After filling the groove openings 48, the surface of the insulating material is planarized with the silicon nitride layer 12 serving as an etch stop so that the top of the surface of the deposited $SiO_2$, 50 is level with the upper surface 55 of the silicon nitride 12 as shown in FIG. 21. Preferably, the chemical/mechanical (chem/mech) polishing with a slurry, as is well known in art, is used to planarize the surface of the insulating material 50. The silicon nitride layer 12 as shown in FIG. 13, now is removed using plasma etching with a gas of $CF_4:O_2$ which is substantially more selective for silicon nitride than silicon oxide.

Figure 22:
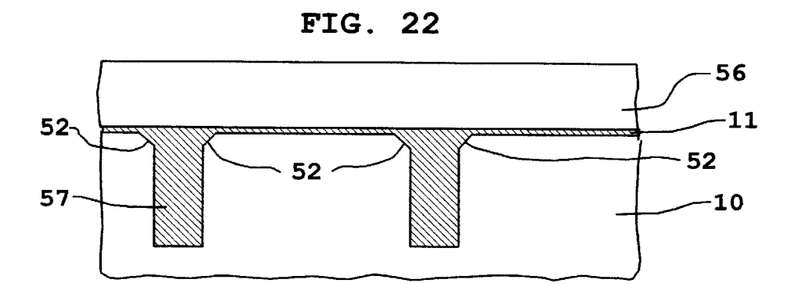
FIG. 22 is a cross-sectional view of the portion of the silicon wafer of FIG. 21 with the edge protective layer removed and with a deposited gate electrode layer.

As shown in FIG. 22, a material, which will function as the gate electrode in the completed FET, and, herein, is polysilicon 56 is deposited and planarized between the filled groove openings or trenches 57. The polysilicon 56 may be doped with an impurity either during or after deposition to lower the resistivity of the polysilicon and make it conductive. Preferably, the doping of the polysilicon 56 is after deposition and with an N-type impurity, such as arsenic (As), during the formation of the source and drain of the N-type FET. The polysilicon layer is patterned using a commercial resist (not shown) to define the gate electrodes 58 after polysilicon is etched in that pattern using, herein, $SF_6:Cl_2$, as shown in FIG. 23.

Figure 23:
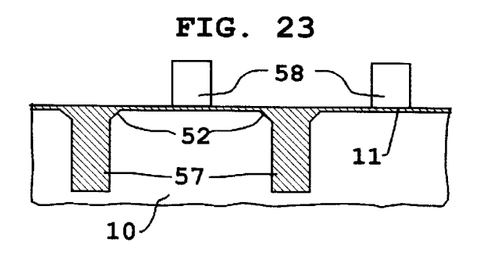
FIG. 23 is a cross-sectional view of the portion of the silicon wafer of FIG. 22 with the gate electrodes defined.
Figure 25:
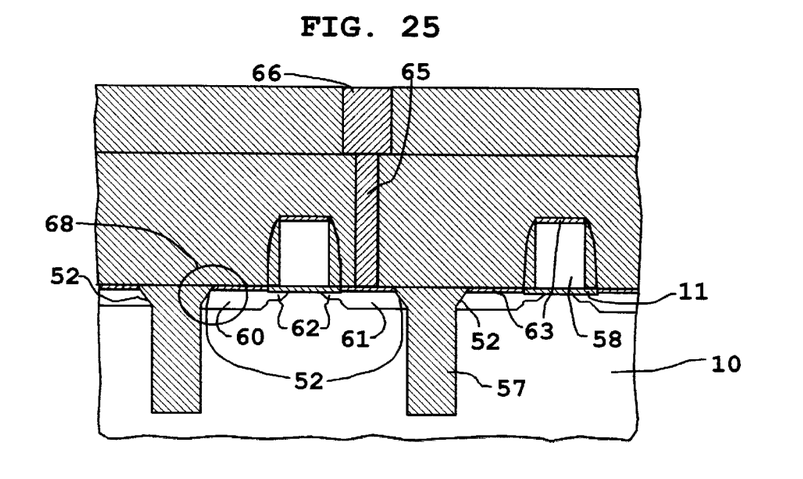
FIG. 25 is a cross-sectional view of the portion of the silicon wafer of FIG. 23 showing gate electrodes as part of completed FETs with a first level interconnection.

By methods well known in the art, the gate electrodes 58 of FIG. 23 form basis for the FETs 59 and interconnections in FIG. 25. The FETs comprise sources 60 and drains 61 containing lightly doped drains 62 and metal silicide contacts 63, herein titanium (Ti), on the source and drain and on the gate electrode 58. Also, titanium silicide is formed on top of trench 57 for forming an interconnection (not shown) to the gate electrodes 50. A contact via 65 from the metal silicide of drain 61 provides electrical connection with other circuits of the integrated circuits of this portion of the wafer 10 through conductive line 66.

Figure 24:
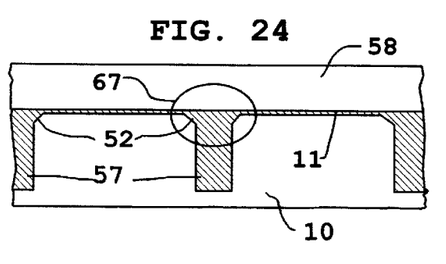
FIG. 24 is a cross-sectional view of the portion of the silicon wafer of FIG. 23 rotated 90° and taken through a gate electrode.

Because of the tapered top 52 of the trench 57, there is no edge or corner structure for a parasitic edge transistor to form, as highlighted by the circle 67 in FIG. 24. Even if the top of the trench is etched when a pad oxide 11a is removed and replaced with the gate oxide 11, the thickness of the remaining oxide will be thicker than the remaining oxide of the prior art trench 18 of FIG. 8. This offers further protection from any possibly formed parasitic transistors from turning on at a lower voltage than the FET. Further, as highlighted in FIG. 25 by circle 68, the tapered top 52 prevents the metal silicide 63 from extending downward at or below the metallurgical junction as it did in the prior art trench 18 to cause the FET to either have leakage or be inoperative due to shorting.

Although this invention has been described relative to specific materials, and semiconductor fabricating apparatus for forming integrated circuits on a wafer, it is not limited to the specific materials or apparatus but only to the specific structural characteristics of the integrated circuits and the method of fabricating such integrated circuits required for the present invention. Other materials and apparatus can be substituted for those described herein which will be well understood by those skilled in the microelectronics and semiconductor arts after appreciating the present invention.

Having thus described the invention, what is claimed is:

1. A method of fabricating integrated circuits in a semiconductor substrate with field effect transistors in active regions insolated by trenches comprising the steps of:

forming a insulating layer and an etch protective layer thereon on the surface a semiconductor substrate;

forming openings in said insulating layer and said etch protective layer forming sidewalls in said openings to define the area of each of the trenches to be etched;

forming grooves in the substrate as defined by the sidewalls;

removing the sidewalls to leave exposed substrate around the grooves;

filling the grooves with an insulating material to form isolating trenches while etching to create tapered substrate surfaces at the top of said grooves, whereby, when the grooves are filled to the surface of the substrate, the tapered tops of the grooves are filled with insulating material to form trenches with tapered tops; and completing the field effect transistors with source and drain regions and metallization layers to interconnect the transistors to form integrated circuits.

2. The method of claim 1 wherein the etching angle of the substrate surface during filling the grooves is about 45°.

3. The method of claim 1 wherein a metal silicide layer is formed in the source and drain regions with one end of each silicide layer adjacent the gate electrode and the other end abutting the tapered top of the trench.

4. The method of claim 1 wherein filling of the groove with insulating material and the etching of the substrate occurs simultaneously.

5. The method of claim 4 wherein, after the tapered tops of substrate surface are created, no further etching is performed.

6. The method of claim 1 wherein the filling of the groove and the etching of the substrate occurs sequentially.

7. The method of claim 1 wherein the tapered tops of the trenches eliminates trench edges with the substrate and thereby prevents the formation of parasitic edge transistors.

8. The method of claim 1 wherein, after the tapered tops of substrate surface are created, no further etching is performed.

9. The method of claim 1 wherein the etch protective layer is removed after the groove is filled with insulating material.

10. The method of claim 1 wherein the sidewalls are formed of a material with a different etch selectivity than the substrate.

* * * * *